United States Patent [19]

Cooperman et al.

[11] Patent Number: 5,235,219

[45] Date of Patent: Aug. 10, 1993

[54] ELECTRICAL CIRCUITRY WITH THRESHOLD CONTROL

[75] Inventors: Michael Cooperman, Framingham; Phillip Andrade, Lexington, both of Mass.

[73] Assignee: GTE Laboratories Incorporated, Waltham, Mass.

[21] Appl. No.: 861,041

[22] Filed: Apr. 1, 1992

[51] Int. Cl.⁵ .......................................... H03K 19/003
[52] U.S. Cl. .................................. 307/443; 307/475; 307/265; 307/296.8
[58] Field of Search ................... 307/475, 451, 296.6, 307/296.8, 443, 520, 362, 265

[56] References Cited

U.S. PATENT DOCUMENTS

| | | | |
|---|---|---|---|
| 4,242,604 | 12/1980 | Smith | 307/443 |
| 4,532,439 | 7/1985 | Koike | 307/451 |
| 4,885,475 | 12/1989 | Farina | 307/265 |
| 4,885,479 | 12/1989 | Oritani | 307/443 |
| 4,922,139 | 5/1990 | Giebel | 307/520 |
| 5,010,259 | 4/1991 | Inoue et al. | 307/451 |
| 5,045,730 | 9/1991 | Cooperman et al. | 307/475 |
| 5,168,180 | 12/1992 | Bayer et al. | 307/296.8 |

Primary Examiner—Edward P. Westin
Assistant Examiner—Jon Santamauro
Attorney, Agent, or Firm—Victor F. Lohmann, III

[57] ABSTRACT

Electrical circuitry for changing the operating voltage conditions of CMOS inverter circuitry so as to shift its threshold voltage in a direction to cause the duty cycle of the output signals to equal the duty cycle of the input signals. An average filtered DC output voltage from the inverter circuitry is used as a control signal to a variable voltage supply which changes the operating voltages, thus shifting the threshold level of the inverter circuitry.

11 Claims, 3 Drawing Sheets

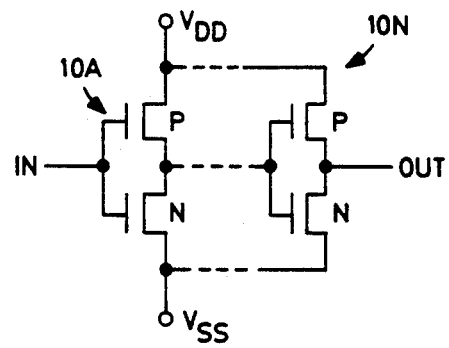
FIG. 1
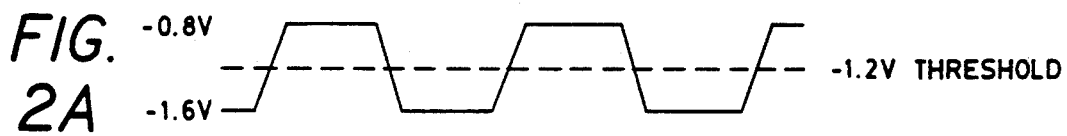
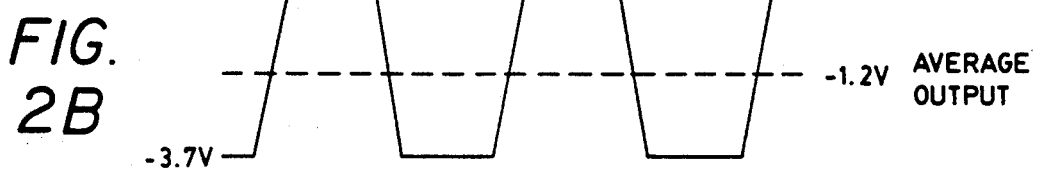
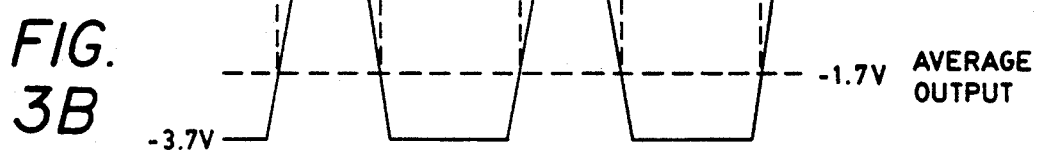

to produce a first output signal at its output when the voltage at its input is greater than a threshold voltage and is operable to produce a second output signal at its output when the voltage at its input is less than the threshold voltage. A voltage supply means supplies operating voltage to the switch-

ELECTRICAL CIRCUITRY WITH THRESHOLD CONTROL

BACKGROUND OF THE INVENTION

This invention relates to electrical circuitry. More particularly, it is concerned with logic circuits having arrangements for interfacing with logic circuitry operating with different logic levels.

Two widely used, well known logic systems are ECL (emitter-coupled logic) and CMOS (complementary metal oxide semiconductor) logic systems. The logic levels for ECL logic are −1.6 volt and −0.8 volt, and for CMOS the logic levels are 0 volts and +5 volts. The threshold voltage for CMOS logic, that is the voltage at which a CMOS logic circuit triggers from one operating state to another, is +2.5 volts. Since this threshold voltage is outside the operating range of ECL logic, CMOS logic circuitry is not directly compatible with ECL circuitry.

One arrangement for shifting the operating voltages of CMOS logic circuitry to provide a threshold value of −1.2 volts (the same as that required by ECL) is described in U.S. Pat. No. 5,045,730 to Cooperman and Sieber. Although shifting of the operating voltages for the CMOS circuitry provides satisfactory operation under normal conditions, variations in the operating conditions of the CMOS circuitry can lead to unwanted variations in the threshold voltage of the CMOS circuitry. Since the ECL voltage levels are separated by only 800 millivolts, a relatively small change in the threshold voltage of the CMOS circuitry could result in malfunction.

SUMMARY OF THE INVENTION

Improved electrical circuitry in accordance with the present invention includes switching circuit means having an input and an output. The switching circuit means is operable to produce a first output signal at its output when the voltage at its input is greater than a threshold voltage and is operable to produce a second output signal at its output when the voltage at its input is less than the threshold voltage. A voltage supply means supplies operating voltages to the switching circuit means. Means are provided for applying input signals to the input of the switching circuit means. A control means is coupled to the output of the switching circuit means and is operable to produce a control signal related to the duty cycle of the output signals at the output of the switching circuit means. A voltage control means is coupled to the voltage supply means and to the control means. The voltage control means is operable in response to a control signal to change the operating voltage conditions supplied to the switching circuit means so as to shift the threshold voltage of the switching circuit means in a direction to cause the duty cycle of the output signals at the output of the switching circuit means to approach a value having a predetermined relationship to the duty cycle of the input signals.

Electrical circuitry in accordance with another aspect of the present invention includes switching circuit means having an input and an output. The switching circuit means is operable to produce a first output signal at its output when the voltage at its input is greater than a threshold voltage and is operable to produce a second output signal at its output when the voltage at its input is less than the threshold voltage. A variable voltage supply means supplies operating voltage to the switching circuit means. Means are provided for applying input signals to the input of the switching circuit means. A control means is coupled to the output of the switching circuit means and is operable to produce a control signal related to the duty cycle of the output signals at the output of the switching circuit means. The variable voltage supply means is coupled to the control means and is operable in response to a control signal to change the operating voltage to the switching circuit means so as to shift the threshold voltage of the switching circuit means in a direction to cause the duty cycle of the output signals at the output of the switching circuit means to approach a value having a predetermined relationship to the duty cycle of the input signals.

Electrical circuitry in accordance with still another aspect of the present invention includes switching circuit means having an input and an output. The switching circuit means is operable to produce a first output signal at its output when the voltage at its input is greater than a threshold voltage and is operable to produce a second output signal at its output when the voltage at its input is less than the threshold voltage. A voltage source means supplies first and second operating voltages to the switching circuit means. A variable voltage supply means is connected to the voltage source means and to a source of reference potential. Means are provided for applying input signals to the input of the switching circuit means. A control means is coupled to the output of the switching circuit means and is operable to produce at its output a control signal related to the duty cycle of the output signals at the output of the switching circuit means. A voltage detection means is coupled to the voltage source means for producing at its output a voltage of predetermined value with respect to the first and second operating voltages. A comparator means has a first input coupled to the output of the control means a second input coupled to the voltage detection means. The comparator means is operable to produce a first comparator output signal at its output when the signal at its first input is greater than the signal at its second input and is operable to produce a second comparator output signal at its the signal at its first input. The variable voltage supply means is coupled to the output of the comparator means and is operable in response to the comparator output signals to shift the operating voltages with respect to the reference potential so as to shift the threshold voltage of the switching circuit means in a direction to cause the duty cycle of the output signals at the output of the switching circuit means to approach a value having a predetermined relationship to the duty cycle of the input signals.

BRIEF DESCRIPTION OF THE DRAWINGS

In the drawings:

FIG. 1 is schematic circuit diagram of electrical circuitry in accordance with the prior art;

FIG. 2A illustrates input signals to the circuit of FIG. 1 under one set of conditions, and FIG. 2B illustrates the resulting output of the circuit of FIG. 1;

FIG. 3A illustrates input signals to the circuit of FIG. 1 under another set of conditions, and FIG. 3B illustrates the resulting output of the circuit of FIG. 1;

Figure 4:
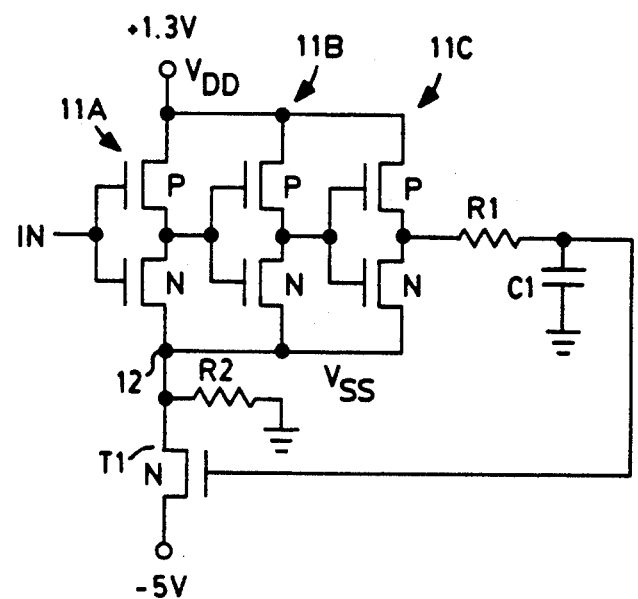
FIG. 4 is a schematic circuit diagram of circuitry in accordance with the present invention.

For a better understanding of the present invention, together with other and further objects, advantages, and capabilities thereof, reference is made to the following disclosure and appended claims in connection with the above-described drawings.

DETAILED DESCRIPTION

FIG. 1 illustrates a CMOS logic switching circuit in which the operating voltages $V_{SS}$ and $V_{DD}$ may be shifted from 0 and +5 volts to −3.7 and +1.3 volts, respectively, in order to provide a threshold level of −1.2 volts as described and explained in the aforementioned U.S. Pat. No. 5,045,730. For purposes of providing an example, the circuitry of FIG. 1 as shown may be CMOS circuitry of a crosspoint switching array as described in U.S. Pat. No. 4,818,988 to Cooperman and Sieber. The circuitry includes an array of CMOS inverter circuits 10A–10N. Each inverter has a P-type MOS transistor and an N-type MOS transistor connected in series between voltage sources $V_{DD}$ and $V_{SS}$. As is well understood, the gates of each pair of inverter transistors are connected together to provide an input and the juncture between them provides an output. When the voltage at the input of an inverter is above the threshold voltage, which is midway between the $V_{DD}$ and $V_{SS}$ voltage levels, the P-type transistor is nonconducting and the N-type transistor is conducting, producing a voltage at the output which is relatively low. When the voltage at the input is below the threshold voltage, the P-type transistor conducts and the N-type transistor is nonconducting, producing a voltage at the output which is relatively high.

When the supply voltage $V_{DD}$ is at +1.3 volts and the supply voltage $V_{SS}$ is at −3.7 volts, the threshold voltage is −1.2 volts. Thus, the circuit of CMOS inverters is adjusted to operate directly with ECL input levels of −0.8 volt and −1.6 volt, providing a threshold level of −1.2 volts. When operating with ECL input level signals, the circuit of FIG. 1 requires at least two inverters in succession in order to ensure that the full CMOS voltage logic levels are produced at the output as explained in U.S. Pat. No. 5,045,730, noted above.

FIG. 2A illustrates ECL signals having finite rise and fall times as applied to the input of the circuit of FIG. 1 when the circuit of FIG. 1 is operating with the ideal threshold voltage of −1.2 volts. FIG. 2B illustrates the corresponding output signals. The output signals have a 50% duty cycle, the same as the input signals, and an average voltage of −1.2 volts, the same as the input signals.

In the event of variations in the operating conditions, the threshold level of the circuit of FIG. 1 may shift. FIG. 3A illustrates ECL input signals as applied while the circuit of FIG. 1 is operating with a threshold voltage of, for example, −1.0 volts, rather than the ideal −1.2 volts. In the resulting output, as illustrated in FIG. 3B, the positive pulses are narrower than the negative pulses, thereby reducing the duty cycle to less than that of the input signals. The average output voltage is reduced, for example, to −1.7 volts. AS can be seen, an increase of the threshold level of the circuit of FIG. 1 to more than −0.8 volts would result in malfunction.

FIG. 4 illustrates electrical circuitry in accordance with the present invention in which a feedback arrangement causes the operating voltage of CMOS inverters to be shifted in a manner so as to compensate for changes in the threshold voltage of the circuitry. As illustrated, the circuit includes an arrangement of three inverters 11A, 11B, and 11C; an odd number being required to provide the desired output polarity. Each inverter includes a P-type MOS transistor and an N-type MOS transistor connected in series between a source of positive voltage (1.3 volts) and a common connection 12. The input is connected to the gates of the MOS transistors of the first inverter 11A, and the output, for purposes of the present discussion, is taken from the juncture of the MOS transistors of the third inverter 11C.

The output of the third inverter 11C passes through an RC network of a resistance R1 in series and a capacitance C1 shunted to ground to the gate of an N-type MOS transistor T1. The transistor T1 is connected between the common connection 12 and a −5 volt power supply. The common connection 12 is connected to ground through a resistance R2.

The resistance-capacitance network R1, C1 operates as a control circuit with a large time constant to filter the output signal and produce an average voltage. Thus, only the DC component of the output signal is transmitted as a control signal from the RC network to the gate of the regulator transistor T1.

Under operating condition, when the threshold level of the circuit becomes more positive than −1.2 volts, the average DC output voltage becomes more positive, as illustrated in FIGS. 3A and 3B. This control voltage to the gate of MOS transistor T1, in effect, changes its resistance thus causing the voltage at the common terminal 12 to become more negative. Since the threshold level of the inverter is half-way between the applied operating voltages, the threshold level is adjusted in a negative direction tending to restore the duty cycle of the output signals to that of the input signals.

The circuit of FIG. 4 as described operates as a self-regulating circuit when the ECL input has a 50% duty cycle. In the event that the average duty cycle of the input signals over a fairly long period of time is not 50%, the circuit may serve as a regulator by employing square-wave input signals of ECL logic levels to ensure a 50% duty cycle. Such a circuit, if on the same chip or in close physical association with other circuits, provides a regulated $V_{SS}$ voltage at the common connection 12 for all circuits subject to the same conditions, thus ensuring that all operate with the same threshold voltage.

Although in the circuitry of FIG. 4, the $V_{SS}$ voltage is varied, the circuit may be modified so the $V_{DD}$ or so that both the $V_{DD}$ and the $V_{SS}$ voltages are varied. The feedback control loop may have gain if desired in order to maintain the duty cycle of the output signals and hence the threshold level with a closer tolerance. The circuitry also operates to provide a proper adjustment of threshold voltage in the event that the average voltage of the ECL input signals is other than −1.2 volt for reasons externally of the CMOS circuitry.

Figure 5:
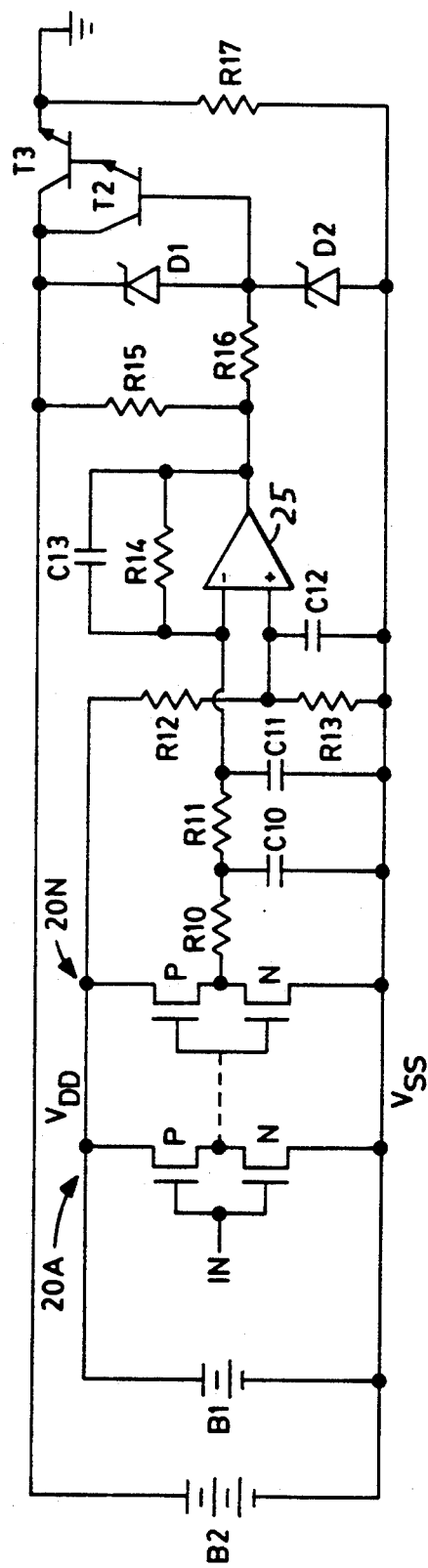
FIG. 5 is a schematic circuit diagram of another embodiment of circuitry in accordance with the present invention.

FIG. 5 illustrates another embodiment of circuitry in accordance with the present invention. A switching circuit of an array of CMOS inverters 20A–20N (an even number for proper polarity in the circuitry as illustrated) is connected across a first voltage source B1 which provides the $V_{DD}$ and $V_{SS}$ operating voltages. The output of the switching circuit is applied to one input of a comparator 25 by way of a control circuit of resistances R10 and R11 in series and capacitors C10 and C11 in shunt. This resistance-capacitance network has a long time constant to filter the output signal and produce an average voltage. Thus, only the DC component of the output signal is transmitted as a control signal to the input of the comparator 25. The other input to the comparator 25 is from a voltage divider R12–R13 across voltage source B1 providing a reference voltage half-way between $V_{DD}$ and $V_{SS}$. A feedback capacitor C13 and resistance R14 are connected from the output to the first input of the comparator 25. A variable voltage supply, the output of which appears across R17, is controlled by the output from comparator 25. This variable voltage supply includes a second voltage source B2 having its negative terminal connected to the negative terminal of the first voltage source B1 ($V_{SS}$). The positive terminal of the second voltage source B2 is connected to a regulator of emitter-follower circuitry which establishes the $V_{SS}$ negative voltage level with respect to ground. $V_{DD}$ will always be a fixed amount of voltage above $V_{SS}$, as established by voltage source B1. Transistors T2 and T3 in a Darlington configuration have their collectors connected to the positive terminal of the second voltage source B2 and the emitter of transistor T3 is connected to ground. A resistance R17 is connected between $V_{SS}$ and ground. The output of the comparator 25 is connected through a resistance R16 to the base of transistor T2. Zener diodes D1 and D2 limit the voltage swing on the gate of T2.

Following are the components of one specific embodiment of the circuitry of FIG. 5

| | |
|---|---|
| B1 | 5 Volts DC |
| B2 | 10 Volts DC |
| Comparator 25 | LM 339 |
| T2 | 2N3904 |
| T3 | MJE 1100 |
| D1 | IN5852 |
| D2 | IN5852 |
| R10 | 10K ohms |
| R11 | 10K ohms |
| R12 | 10K ohms |
| R13 | 10K ohms |
| R14 | 1 Meg ohms |
| R15 | 1K ohms |
| R16 | 1K ohms |
| R17 | 30 ohms |
| C10 | 1 Microfarad |
| C11 | 1 Microfarad |
| C12 | 1 Microfarad |
| C13 | 130 Microfarads |

The circuitry of FIG. 5 as shown and described compares the voltage mid-way between the $V_{DD}$ and $V_{SS}$ operating voltages of the CMOS inverters with the average filtered DC output voltage of the CMOS inverters. Depending on the relationship of these voltages as determined by the comparator, the emitter-follower regulator adjusts the voltage level at the negative terminal of the voltage source B2 with respect to ground. Thus both the $V_{DD}$ and $V_{SS}$ voltages are shifted with respect to ground so that the duty cycles of the input signals and output signals and hence the average input and output voltages are the same. The circuitry functions to shift the threshold level of the inverters to the average voltage of the input signals regardless of the conditions causing a discrepancy.

The circuit of FIG. 5 as described operates as a self-regulating circuit when the ECL input has a 50% duty cycle. In the event that the average duty cycle of the input signals is not 50%, the circuit may serve as a regulator by employing a square wave input signal of ECL logic levels to insure a 50% duty cycle. Such a circuit, if on the same chip or in close physical association with other circuits, will provide a common $V_{SS}$ and $V_{DD}$ offset from ground the correct amount to insure that all operate with the same threshold voltage.

While there has been shown and described what are considered preferred embodiments of the present invention, it will be obvious to those skilled in the art that various changes and modifications may be made therein without departing from the invention as defined by the appended claims.

What is claimed is:

1. Electrical circuitry including:

switching circuit means having an input and an output, said switching circuit means being operable to produce a first output signal at its output when the voltage at its input is greater than a threshold voltage and being operable to produce a second output signal at its output when the voltage at its input is less than the threshold voltage;

voltage supply means for supplying operating voltage to the switching circuit means;

means for applying input signals to the input of the switching circuit means;

control means coupled to the output of the switching circuit means and operable to produce a control signal related to the duty cycle of the output signals at the output of the switching circuit means; and voltage control means coupled to said voltage supply means and to said control, means and being operable in response to said control signal to change the operating voltage conditions supplied to the switching circuit means so as to shift the threshold voltage of the switching circuit means in a direction to cause the duty cycle of the output signals at the output of the switching circuit means to approach a value having a predetermined relationship to the duty cycle of the input signals.

2. Electrical circuitry in accordance with claim 1 wherein said voltage control is operable in response to a control signal to change the operating voltage conditions supplied to the switching circuit means so as to shift the threshold voltage of the switching circuit means in a direction to cause the duty cycle of the output signals at the output of the switching circuit means to approach the duty cycle of the input signals.

3. Electrical circuitry including switching circuit means having an input and an output, said switching circuit means being operable to produce a first output signal at its output when the voltage at its input is greater than a threshold voltage and being operable to produce a second output signal at its output when the voltage at its input is less than the threshold voltage;

variable voltage supply means for supplying operating voltage to the switching circuit means;

means for applying input signals to the input of the switching circuit means; and control means coupled to the output of the switching circuit means and operable to produce a control signal related to the duty cycle of the output signals at the output of the switching circuit means.

said variable voltage supply means being coupled to said control means and being operable in response to said control signal to change the operating voltage conditions supplied to the switching circuit means so as to shift the threshold voltage of the switching circuit means in a direction to cause the duty cycle of the output signals at the output of the switching circuit means to approach a value having a predetermined relationship to the duty cycle of the input signals.

4. Electrical circuitry including:
switching circuit means comprising an inverter of a complementary pair of MOS transistors connected in series between a first voltage supply means for producing a first supply voltage and a second voltage supply means for producing a second supply voltage;
the gates of said MOS transistors being connected directly together at an input and the juncture of said MOS transistors being connected to an output;
said inverter being operable to produce a first voltage signal at the output when the voltage at the input is greater than a threshold voltage which is midway between the first supply voltage and the second supply voltage, and said inverter being operable to produce a second voltage signal at the output when the voltage at the input is less than the threshold voltage;
one of said voltage supply means being a variable voltage supply means;
means for applying input signals to said input; and
control means coupled to said output and operable to produce a control signal related to the duty cycle of the first and second voltage signals at said output;
said variable voltage supply means being coupled to said control means and being operable in response to control signals therefrom to change the supply voltage produced to shift the threshold voltage of the inverter in a direction to cause the duty cycle of the first and second voltage signals at said output to approach the duty cycle of the input signals.

5. Electrical circuitry in accordance with claim 4 wherein
said control means includes a resistance-capacitance network connected between the output of the switching circuit means and the variable voltage supply means.

6. Electrical circuitry in accordance with claim 5 wherein:
one of said MOS transistors is a P-type transistor and the other of said MOS transistors is an N-type transistor; and
said P-type transistor being connected to the first voltage supply and the N-type transistor being connected to the second voltage supply, the voltage of said second voltage supply being negative with respect to the voltage of the first voltage supply.

7. Electrical circuitry in accordance with claim 6 wherein:
said variable voltage supply includes an N-type MOS transistor connected between the N-type MOS transistor of the inverter and a source of negative voltage; and
the gate of said N-type MOS transistor of the variable voltage supply being connected to the juncture of the resistance and capacitance of the resistance-capacitance network.

8. Electrical circuitry including
switching circuit means having an input and an output, said switching circuit means being operable to produce a first output signal at its output when the voltage at its input is greater than a threshold voltage and being operable to produce a second output signal at its output when the voltage at its input is less than the threshold voltage;
voltage source means for supplying first and second operating voltages to said switching circuit means;
variable voltage supply means connected to said voltage source means and to a source of reference potential;
means for applying input signals to the input of the switching circuit means;
control means coupled to the output of the switching circuit means and operable to produce at its output a control signal related to the duty cycle of the output signals at the output of the switching circuit means;
voltage detection means coupled to said voltage source means for producing at its output a voltage of a predetermined value with respect to said first and second operating voltages; and
comparator means having a first input coupled to the output of said control means, and a second input coupled to said voltage detection means, and being operable to produce a first comparator output signal at its output when the signal at its first input is greater than the signal at its second input, and being operable to produce a second comparator output signal at its output when the signal at its second input is greater than the signal at its first input;
said variable voltage supply means being coupled to the output of said comparator means and being operable in response to said comparator output signals to shift the operating voltages with respect to said reference potential so as to shift the threshold voltage of the switching circuit means in a direction to cause the duty cycle of the output signals at the output of the switching circuit means to approach a value having a predetermined relationship to the duty cycle of the input signals.

9. Electrical circuitry including
switching circuit means comprising an inverter of a complementary pair of MOS transistors connected in series across a first voltage source which provides operating voltages thereto; the gates of said MOS transistors being connected directly together at an input and the juncture of said MOS transistors being connected to an output;
said inverter being operable to produce a first voltage signal at the output when the voltage at the input is greater than a threshold voltage which is mid-way between the operating voltages across the pair of MOS transistors, and said inverter being operable to produce a second voltage signal at the output when the voltage at the input is less than the threshold voltage;
a second voltage source connected to said first voltage source;
means for applying input signals to said input;
control means coupled to said output and operable to produce a control signal related to the duty cycle of the first and second voltage signals at said output;
voltage detection means connected across said first voltage source for producing a voltage which is midway between the operating voltages of the first voltage source;

comparator means having a first input coupled to said control means and a second input coupled to said voltage detection means, and being operable to produce a first comparator output signal at its output when the signal at its first input is greater the signal at its second input, and being operable to produce a second comparator signal at its output when the signal at its second input is greater than the signal at its first input; and regulator means connected between said second voltage source and a source of reference potential and coupled to said comparator means, said regulator means being operable in response to said comparator output signals to change the voltage between the source of reference potential and the second voltage source so as to shift the threshold voltage of the inverter in a direction to cause the duty cycle of the first and second voltage signals at said output to approach the duty cycle of the input signals.

10. Electrical circuitry in accordance with claim 9 wherein said control means includes a resistance-capacitance network connected between the output of the switching circuit means and said comparator means.

11. Electrical circuitry in accordance with claim 10 wherein one of said MOS transistors is a P-type transistor and the other of said MOS transistors is an N-type transistor; and said P-type transistor is connected to an operating voltage which is positive in respect to the operating voltage to which the N-type transistor is connected.

* * * * *